United States Patent
Waters et al.

(10) Patent No.: US 9,230,290 B2
(45) Date of Patent: Jan. 5, 2016

(54) POWER METER CONSUMPTION SYSTEM AND METHOD TO VERIFY DATA STORED IN A REGISTER BY COMPARING AN ADDRESS OF THE REGISTER WITH REQUEST FOR DATA OF THE REGISTER

(75) Inventors: Michael G. Waters, Houston, TX (US); Zachary J. Gerbozy, Spring, TX (US); Reginald A. Whyte, Jr., Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 370 days.

(21) Appl. No.: 13/457,770

(22) Filed: Apr. 27, 2012

(65) Prior Publication Data

US 2013/0290568 A1    Oct. 31, 2013

(51) Int. Cl.
*G06F 3/00* (2006.01)
*G06Q 50/06* (2012.01)
*G01R 21/133* (2006.01)

(52) U.S. Cl.
CPC ............. *G06Q 50/06* (2013.01); *G01R 21/133* (2013.01)

(58) Field of Classification Search
CPC .............................. G01R 21/133; G06Q 50/06
USPC .......... 710/5, 8–10, 15–19; 702/130, 62, 223; 700/295
See application file for complete search history.

(56) References Cited

U.S. PATENT DOCUMENTS

| | | | | |
|---|---|---|---|---|
| 5,428,351 | A * | 6/1995 | Lee, Jr. ................ | G01R 21/133 340/10.31 |
| 5,448,229 | A * | 9/1995 | Lee, Jr. ................ | G01R 21/133 340/10.51 |
| 5,459,459 | A * | 10/1995 | Lee, Jr. .................... | 340/870.02 |
| 6,219,656 | B1 * | 4/2001 | Cain et al. ..................... | 705/412 |
| 6,304,191 | B1 * | 10/2001 | Campbell et al. ......... | 340/870.14 |
| 6,650,967 | B1 * | 11/2003 | Got ................... | H01M 10/4207 307/64 |
| 6,895,365 | B2 | 5/2005 | Voorhees et al. | |
| 6,904,385 | B1 * | 6/2005 | Budike, Jr. .................... | 702/182 |
| 7,058,524 | B2 * | 6/2006 | Hayes et al. .................... | 702/62 |
| 7,089,089 | B2 * | 8/2006 | Cumming et al. ............ | 700/295 |
| 7,228,372 | B2 | 6/2007 | Yoshimura et al. | |
| 7,256,709 | B2 * | 8/2007 | Kagan .................... | G01D 4/004 340/870.02 |
| 7,561,062 | B2 * | 7/2009 | Schleich et al. ......... | 340/870.02 |
| 7,953,565 | B2 * | 5/2011 | Kagan ............................. | 702/62 |
| 8,086,761 | B2 | 12/2011 | Huang et al. | |
| 8,102,710 | B2 | 1/2012 | Pekny et al. | |
| 8,332,055 | B2 * | 12/2012 | Veillette .......................... | 700/20 |
| 8,798,801 | B2 * | 8/2014 | Subbloie ................ | G06Q 50/06 700/291 |
| 2004/0003298 | A1 * | 1/2004 | Luick .................... | G06F 1/3203 713/300 |
| 2006/0271314 | A1 * | 11/2006 | Hayes .............................. | 702/62 |
| 2011/0122978 | A1 | 5/2011 | Peichel et al. | |

FOREIGN PATENT DOCUMENTS

KR    20070010945    1/2007

* cited by examiner

*Primary Examiner* — Tammara Peyton
(74) *Attorney, Agent, or Firm* — Vancott Bagley Cornwall & McCarthey

(57) ABSTRACT

Communicating with verified data includes receiving a request with a first device where the request is addressed to a register within the first device and sending a response with the first device to a second device where the response includes an address of the register.

19 Claims, 5 Drawing Sheets

POWER METER CONSUMPTION SYSTEM AND METHOD TO VERIFY DATA STORED IN A REGISTER BY COMPARING AN ADDRESS OF THE REGISTER WITH REQUEST FOR DATA OF THE REGISTER

BACKGROUND

Some digital communications systems rely on precise timing and signal accuracy. As a result, some communication protocols include mechanisms to ensure that the data exchanged between devices is trustworthy. In such applications, devices exchanging data may send several messages to each other to ensure that the data exchanged is accurate.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

Digital signals are prone to change when affected by outside influences, which are generally referred to as electrical noise. Data in the digital signals that have been altered may be referred to as corrupted data. High data integrity may refer to non-corrupted data. These outside influences may be created by magnetic or electric field fluctuations caused by nearby equipment or cables. The signals may be affected by such noise after the signal has been transmitted and while the signal is still traveling along on a transmission path. In such a case, the digital signal is sent correctly, but is altered before reaching its destination. In other cases, the signal is affected before the signal is sent. In either situation, the signal's destination receives a distorted message. If the distortion is undetected, the destination may act upon the altered message. The consequences of acting upon a distorted message depends on the degree that the message is altered.

The present specification describes subject matter including, for example, a method for communication with verified data. Examples of such a method include receiving a request with a first device where the request is addressed to a register within the first device and sending a response with the first device to a second device where the response includes an address of the register.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
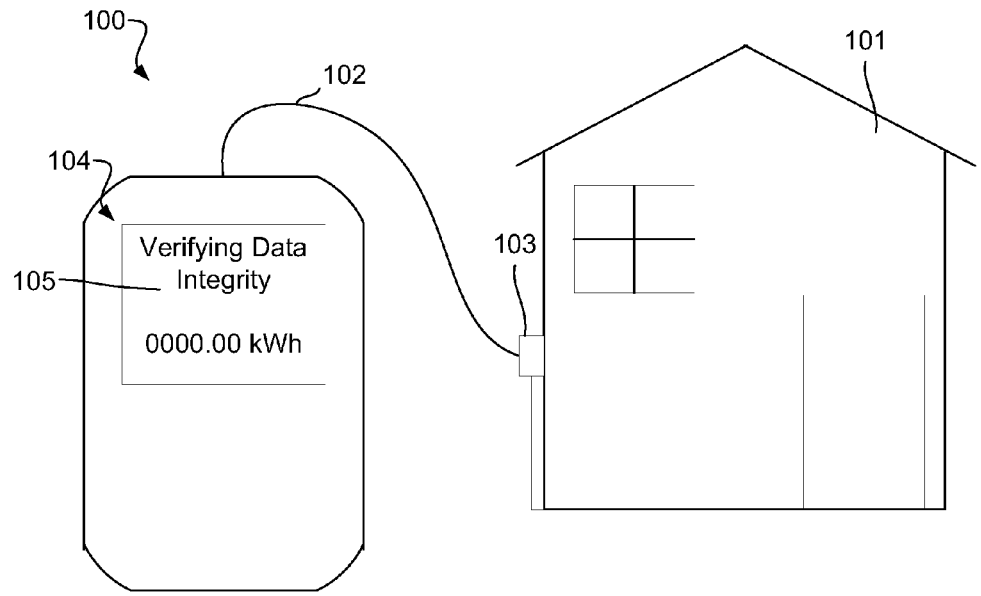
FIG. 1 is a diagram of an illustrative device, according to principles described herein.

FIG. 1 is a diagram of an illustrative device (100), according to principles described herein. In this example, the device (100) is a power meter that reads the energy consumption of buildings (101). In this illustrated example, a cable (102) connects the device (100) to a panel (103) of the building (101) to read the building's energy consumption.

When connected through the cable (102) the device (100) may request from the panel (103) information about the building's energy consumption. Upon request, the panel (103) may consult an internal register addressed in the device's request that contains a value for the amount of energy consumed. The panel (103) may respond to the device (100) with a message that includes the requested data from the register, an address of the register from which the data was retrieved, and a checksum to protect the data from corruption.

A checksum may be a dedicated portion of the response's code that is computed for the purpose of detecting errors in the response. The device (100) may determine a value based on the response and compare the calculated value to the checksum. If they fail to match, the device (100) may consider that data in the response is corrupted.

The electrical circuits connected to the panel (103) may generate electrical noise due to electrical fluctuations. In some circumstances, the noise affects the panel's response to the device (100) and corrupts the data in the response. For example, as the response is traveling through the cable towards the device (100), noise from the electrical circuits may influence the message encoded in the response. As a result, portions of the message may be altered. For example, the register's address, the checksum, the requested data, or combinations thereof may be altered. As a consequence, the data in the response may be unreliable depending on the severity of the alteration and which portions of the message are altered.

However, the device (100) upon receipt of the response may compare the register's address to the register that the device (100) sent the request. If the register in the request and the register's address in the response fail to match, the device (100) may determine that the response's data is unreliable due to noise. Upon determining that the response's data is unreliable, the device (100) may resend the request to the panel (103). Upon receipt of a second response, the device (100) may compare the register identified in the resent request to the register's address in the response. If the register and the register's address match, the device may determine that the data is accurate.

Further, the device (100) may evaluate the checksum to determine whether the data has been altered. The checksum may be a predefined portion of the response used to determine the integrity of the data in the response. The device (100) may be capable of computing a value as it evaluates the response. If the calculated value and the received checksum value fail to match, the device (100) may resend the request to retrieve the accurate data.

The device (100) may keep resending the request until both the register's address and the checksum indicate that the data is accurate. In some examples, the device (100) has a resend threshold, such as three resends, before the device (100) will determine that some error other than an error due to noise is affecting the message. In some examples, the device (100) has an error detection policy that seeks to determine the error and determine whether the data is reliable. In other examples, a policy of the device (100) determines that the data in the resent responses is reliable if the data from each of the resent responses was consistent. In other examples, the policy considers the data in the resent messages to be unreliable despite any consistency.

In FIG. 1, the device (100) has a display (104) that indicates the amount of energy consumed by the building (101) in kilowatt hours. Also, the display (104) has a message field (105) that indicates to the user the status of the reading. In this illustrated example, the message field (105) indicates that the device (100) is verifying the integrity of the data. Such a message may appear as the device (100) resends the requests or as the device (100) evaluates the register's address in the response and/or the checksum.

Figure 2:
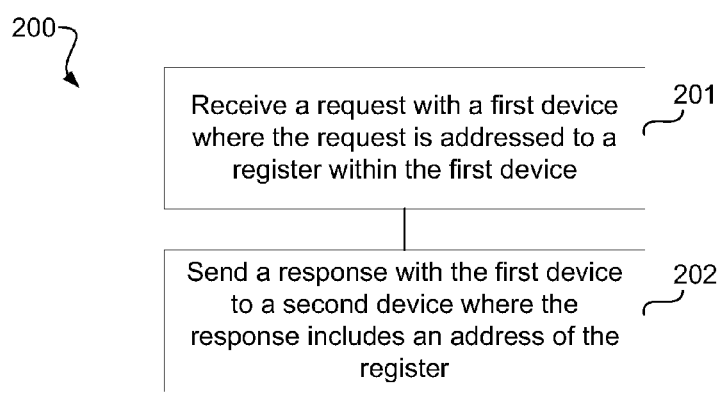
FIG. 2 is a diagram of an illustrative method for communicating with accurate data, according to principles described herein.

FIG. 2 is a diagram of an illustrative method (200) for communicating with accurate data, according to principles described herein. In this example, the method (200) includes receiving (201) a request with a first device where the request is addressed to a register within the first device and sending (202) a response with the first device to a second device where the response includes an address of the register.

The method (200) may further include receiving a chip select signal prior to receiving the request. Such a chip select signal may indicate to the register that a message is forthcoming. In some examples, the first device contains multiple registers and the chip selection signal indicates to the selected register to execute the commands in the forthcoming request while the non-selected registers are to ignore the forthcoming request.

The request may contain a first byte and a second byte. Each byte may contain eight bits of binary information. The first byte may contain a command. In some examples, the command is a write command or a read command. The second byte may include the register's address.

The response from the first device may include the register's address, any data requested in the command portion of the request, and a checksum. The register's address and the checksum may be included in the response so that the response recipient may evaluate the data's integrity. In some examples, the first device performs no other task to ensure that the data is accurate. If the register's address or the checksum from the response indicate corrupted data, then the recipient may resend the response to the first device. The recipient may continue to resend the request until the recipient has confidence, according to its internal policy, that the response data is accurate.

Figure 3:
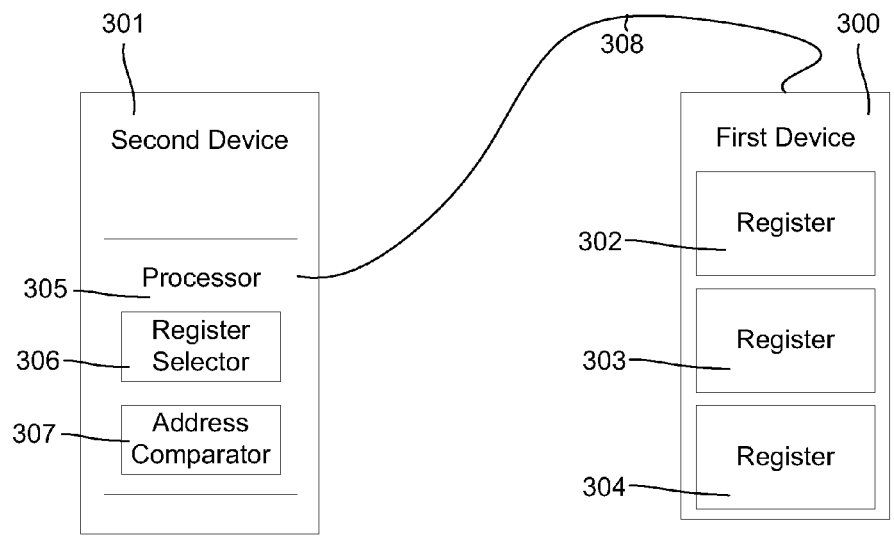
FIG. 3 is a diagram of illustrative devices, according to principles described herein.

FIG. 3 is a diagram of an illustrative first device (300) and an illustrative second device (301), according to principles described herein. In this example, a first device (300) has multiple registers (302, 303, 304). The first device (300) may be selected from the following non-exhaustive list of devices that includes sensors, temperature sensors, pressure sensors, power meters, touch screens, controllers, gaming controllers, codecs, potentiometers, memory, clocks, displays, field programmable gate arrays, telecommunication devices, cameras, microphones, peripheral devices, video players, audio players, other devices, or combinations thereof.

The second device (301) may include a processor (305) that contains an address for at least one of the registers (302, 303, 304) in the first device (300). When the processor (305) determines that it wants to read or write information into one of the registers (302, 303, 304), a register selector (306) may select the register intended for the read or write operation. The register selector (306) may send a signal to the first device (300) that indicates to the selected register (302) that it is selected for the forthcoming message. The signal does not indicate to the other registers (303, 304) that the forthcoming signal is for them, and as a consequence, registers (303, 304) ignore the forthcoming message.

If the forthcoming message includes a read command, register (302) may send a response that includes the register's address and the requested data. If the forthcoming message includes a write command, register (302) may write the specified data in its memory and send a response with its register's address. In some examples where the request is a write request, the register may send a response that repeats the data sent in the request with a checksum in addition to the register's address.

Upon receipt of the responses, an address comparator (307) of the second device (301) may compare the register's address in the response with register to which the second device sent the request. If the register and the register's address match, the second device may have confidence that the data was accurately exchanged. However, if the data appears to be corrupted due to a mismatch of the register and the register's address, then the second device (301) may resend the request. The second device (301) may continue to resend the request until the second device (301) has confidence that the exchanged data is accurate.

The first and the second devices (300, 301) may be connected by an electrically conductive medium (308). In some examples, the electrically conductive medium (308) is group of wires connecting the processor (305) of the second device (301) to the registers (302, 303, 304) of the first device (300). In some examples, the first device (300) and the second device (301) are connected through a serial peripheral interface bus. In such examples, the processor (302) and the registers (302, 303, 304) may be arranged in an independent master/slave topology where the processor (305) is directly connected to each of the registers (302, 303, 304) with independent wires. In other examples with a serial peripheral interface bus arrangement, the processor (305) and the registers (302, 303, 304) may be arranged in a daisy-chain arrangement where the outputs preceding registers are connected to the input of the subsequent registers allowing a single wire to connect the first and the second devices (300, 301). For example, an output of register (302) may be connected to an input of register (303) and an output of register (303) may be connected to an input of (304).

In alternative examples, the first device just has a single register. In such an example, the second device may still send a chip select signal. However, in some examples where the first device has a single register, the second device does not send a chip select signal.

In the example of FIG. 3, the electrically conductive medium (308) is directly connected to the processor (305). As a consequence, the amount of memory available to run mechanisms to verify the data's integrity is limited. By inserting the register's address and the checksum directly into the data that the second device (301) is collecting, the processor (305) may verify the integrity of the data without significant processing or significant additional overhead.

Figure 4:
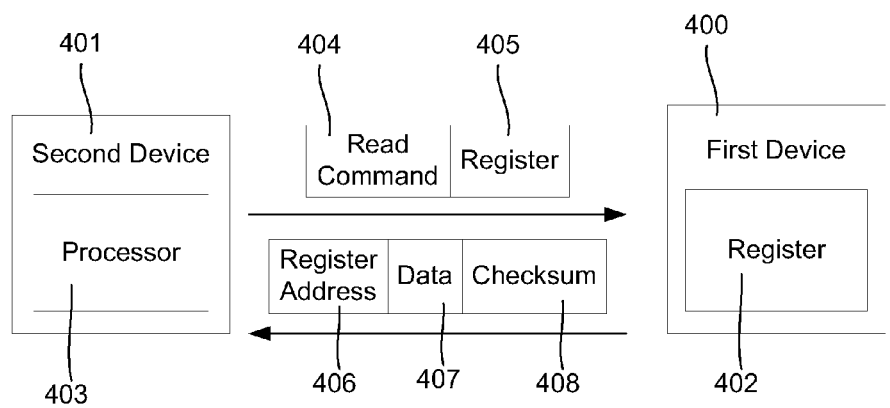
FIG. 4 is a diagram of illustrative devices, according to principles described herein.

FIG. 4 is a diagram of illustrative devices (400, 401), according to principles described herein. In this example, the first device (400) has a register (402), and the second device (401) has a processor (403).

In the illustrated example, the processor (403) sends a request to the register (402). The request may include a first byte (404) and a second byte (405) of information. The first byte (404) includes a command. In this example, the command is a read command where the processor (403) is requesting information from the register (402). In other examples, the command is a write command, where the request includes data bytes to be written into the register (402). The second byte (405) may contain the address of the register (402) to which the request is being sent. The first byte (404) may precede the second byte (405) in the request or the order may be reversed. In some examples, additional bytes of information are included in the request.

The register (402) of the first device (400) may send a response to the request. In the illustrated example, the response includes a third byte (406) that includes an address of the register (402). In some examples, the third byte (406) merely repeats the second byte (405) in the request. In other examples, the register (402) obtains this information from another location. Following the third byte (406), the response may include fourth byte (407) that contains data. In this example, this data includes the data that the processor requested. In some examples, more than one byte of information is included. In some examples, at least four bytes of data are sent in the response. However, any number of bytes containing the requested data may be included in the response. In FIG. 4, the data bytes (407) are followed by a fifth byte (408) that contains a checksum. In some examples, the checksum is a summing checksum.

Upon receipt of the response, the processor (403) may compare the information in the third byte (406), which contains the register's address, to the register (402) to which the request was sent. In some examples, the processor (403) compares this information while the remainder of the response is still being received. If the processor (403) determines based on the comparison of the address information that the data is corrupted prior to finalizing the receipt of the response, the processor (403) may discontinue receiving the response. However, if this information matches, the processor (403) may proceed to evaluate the checksum to determine whether the data is corrupted. In some examples, the processor (403) may evaluate the register's address and the checksum simultaneously, while in other examples, the processor (403) evaluates them separately.

If the processor (403) determines that the data is corrupted through either the evaluation of the received register's address or the evaluation of the checksum, the processor (403) may resend the request to the register (402). The register (402) may resend the response to the processor (403). If the processor (403) again determines that the resent response also contains corrupted information, the processor (403) may continue to request the information.

In examples where the data is corrupted, the data may be altered due to electrical noise. In some examples, the information in the register (401) may be altered while being stored. In other examples, the information is correct when the response was sent, but the response was altered after the information while in transit.

In some examples, the processor (403) has confidence that the information in the response is accurate by sending just one request and analyzing the response. In some examples, the first device (400) sends just the response to provide the second device (401) will all the information that it needs to determine the integrity of the response's data. Further, the register (401) does not need to perform any validation tasks to verify that the request is correct. Such a process may reduce transmission overhead, speed up processing time, simplify processing circuitry, provide more accurate results, and combinations thereof.

In some examples, the data in a request is corrupted from an event that occurred while the information was in storage or while the request was in transit. In such a situation, the register is likely to respond incorrectly to the request and the resulting third byte (406) with the register's address and the resulting fifth byte (408) with the checksum may contain errors. As a consequence, the processor (403) may determine that the response contains corrupted data and resend the request.

In some examples, the processor (403) sends the response to off-chip memory storage or the processor (403) stores the response in its own internal memory. For example, the processor (403) may send the response to storage within the second device (401). At a later time, the processor (403) may retrieve the response. Prior to acting upon the information stored in the response, the processor (403) may verify that the data did not corrupt while in storage by evaluating the register's address and the checksum in the response. If the processor (403) determines that the data was corrupted in storage, the processor (403) may resend a request to the register (402) if the first and second devices (400, 401) are still connected. In some examples, if the first and second devices (400, 401) are no longer connected, the processor (403) may cause a display on the second device (401) to indicate that a processing error has occurred.

Figure 5:
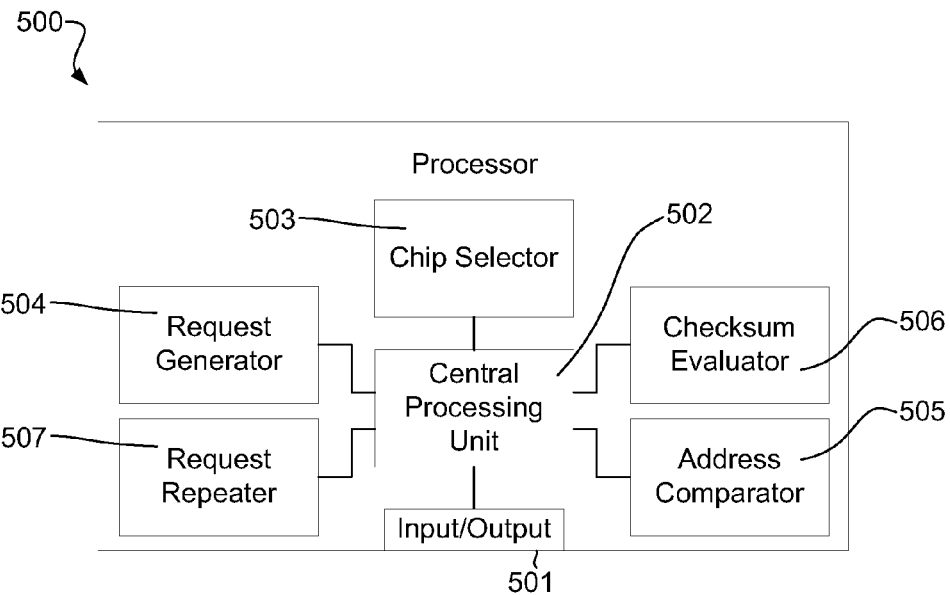
FIG. 5 is a diagram of an illustrative processor, according to principles described herein.

FIG. 5 is a diagram of an illustrative processor (500), according to principles described herein. The processor (500) may be incorporated into a device, system, apparatus, other tangible tool, or combinations thereof that has the ability to connect with a device that contains a register. In this example, the processor (500) has an input/output (501). In some examples, the input/output (501) is hard wired to the register. In other examples, the input/output (501) is in communication with a port that receives an end of an electrically conductive medium, such as a wire, cable, bus, other medium, or combinations thereof. In such examples, when the end of the medium is connected within the port, the medium may put the register in communication with the input/output (501).

In this example, the input/output (501) is in communication with a central processing unit (CPU) (502) of the processor (500). The CPU (502) may be in communication with a chip selector (503) that generates a signal to indicate to the register that the register is the intended recipient of a forthcoming message. In examples where the processor (500) is in communication with more than one register, the chip selector (503) may determine which register either contains the information desired by the processor (500) or to which register the processor (500) should write information.

In some examples, more than one register has an independent connect to the input/output (501) of the processor (500). In such examples, the processor (500) may modify an electrical characteristic of the selected register's independent connection to the processor (500). For example, the processor (500) may cause a switch to close that decreases the impedance on the connection with the register. While the impedance is altered, the associated register on that connection may recognize that it is the intended recipient of any requests forthcoming from the processor (500). Such examples also reduce the transactions between the processor (500) and the selected register.

A request generator (504) may generate the request intended for the selected register. The request may contain an address of the register as well as a command for the register to execute. In some examples, the command is a read or write command. After sending the request, the processor (500) may receive a response from the register. In examples where request contains a read command, the response may contain data from the register and the register's address. In examples where the request contained a write command, the response may contain at least the register's address; however, in some examples, a response to a write request may contain additional data.

Upon receipt of the registers address in the response, the CPU (502) may forward the address information to an address comparator (505) to compare the response's address information to the address that the processor (500) sent the request. In examples where the data in the response was protected with a checksum, the CPU (502) may send the checksum information to a checksum evaluator (506) to determine whether the data is corrupted. If either the address comparator (505) or the checksum evaluator (506) finds an error, the processor (500) may ignore the response. In such an event, a request repeater (507) may cause the processor (500) to resend the request.

In the event that the processor (500) is confident that the information that it received is substantially free of corruption, the processor (500) may terminate its exchange with the register. In some examples, the termination includes the chip selector (503) restoring any altered electrical characteristic on the connection with the register to its original value. For example, if a switch was closed on the connection linking the processor (500) to the register, then chip select may cause the switch to open to return the electrical characteristics to the levels they were prior to the selecting the register.

Figure 6:
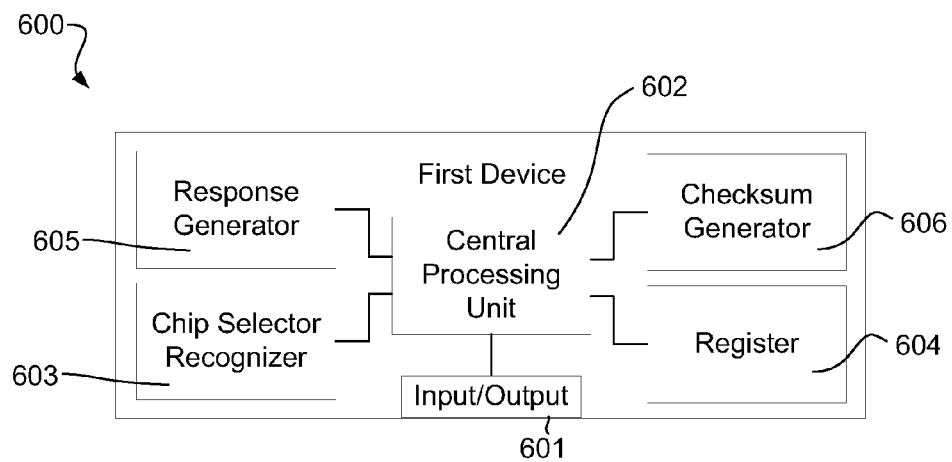
FIG. 6 is a diagram of an illustrative device, according to principles described herein.

FIG. 6 is a diagram of an illustrative first device (600), according to principles described herein. In this example, the first device (600) contains an input/output (601). In some examples, the input/output (601) is hard wired to the processor of a requesting device that may send read or write commands to the first device (600). In other examples, the input/output (601) is in communication with a port that receives an end of an electrically conductive medium, such as a wire, cable, bus, other medium, or combinations thereof. In such examples, when the end of the medium is connected within the port, the medium may put the processor of the requesting device in communication with the input/output (601).

In FIG. 6, the first device (600) has a central processing unit (CPU) (602) in communication with the input/output (601). A chip selector recognizer (603) of the first device (600) may recognize when a register (604) of the first device (600) is selected for receiving a request.

When the first device (600) receives a request for the register (604), a response generator (605) may generate a response. In some examples, the response includes the register's address. In some examples, the response generator (605) locates the register's address within the first device (600) to include in the response. In other examples, the address generator (605) repeats the address information contained in the request. In examples where the request contains a write command, the response may include the data requested in the response. Further, in some examples where data is included in the response, a checksum generator (606) may cause a checksum to be inserted into the response.

After generating all of the components of the response, the response may be sent back to the requesting device through the input/output (601). The inclusion of the register's address, and in some cases the further inclusion of the checksum, may provide the requesting device all of information that the requesting device needs to determine whether the data in the response is accurate. Thus, a response in accordance with the principles described herein allows the requesting device to determine the integrity of the data in the response without further operation by the first device and/or the register.

In some examples, the first device (600) receives the request again. In such examples, the requesting device may determine, upon evaluation of the register's address and/or the checksum in the response, that the information in the response is corrupted. In such an event, the components of the first device (600) may regenerate the response. In some examples, the data in the response is corrupted while the data is in transit to the requesting device. In such an event, the second response will likely be generated with high integrity data before it is transmitted to the requesting device. The requesting device may re-evaluate the second response to determine the integrity of the data. In some examples, the requesting device continues to resend the request until the requesting device determines that it received a response with non-corrupted data or that the requesting device will not have confidence in the reliability of the data in the responses.

In some examples where the requesting device determines that it cannot have confidence in the responses' data, the requesting device may display that there is an error to a user of the requesting device. In other examples where the requesting device determines that it cannot have confidence in the responses, the requesting device may give the user troubleshooting suggestions to improve the likelihood that the subsequent responses will not be corrupted. For example, a troubleshooting suggestion may include requesting the user to determine if the requesting device may be moved away from power sources or other specific types of equipment that are prone to generating electrical noise. In other examples, a troubleshooting suggestion includes turning off nearby equipment that may be interfering with the responses.

Figure 7:
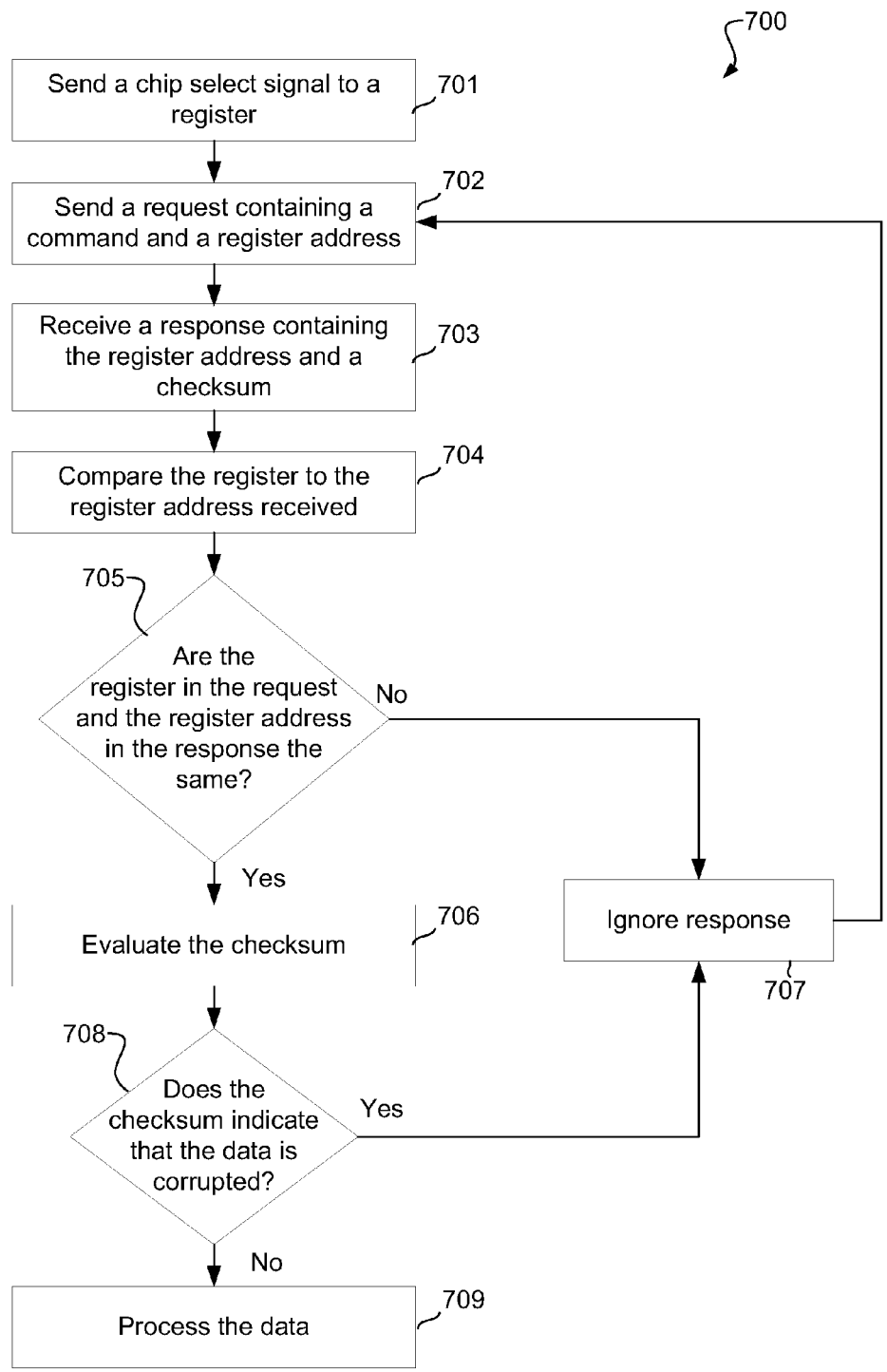
FIG. 7 is a diagram of an illustrative flowchart of a process for communicating, according to principles described herein.

FIG. 7 is a diagram of an illustrative flowchart (700) of a process for communicating, according to principles described herein. In the illustrated example, the flowchart (700) includes sending (701) a chip select signal to a register followed with sending (702) a request containing a command and a register's address. The process may also include receiving (703) a response containing the register's address and a checksum. After receipt, the process includes comparing (704) the register to which the request was sent to the register's address in the response. Upon comparison, the process includes determining (705) whether the register in the request matches the register's address in the response. If they match, then the checksum is evaluated (706). If they fail to match, then the response is ignored (707) and the response is resent (702).

In this example, the process includes determining (708) whether the checksum indicates that the data in the response is corrupted. If the checksum indicates that the data is corrupted, the process may include ignoring (707) the response and resending (702) the request. If the checksum indicate that the data is good, then the data in the response may be processed (709).

Figure 8:
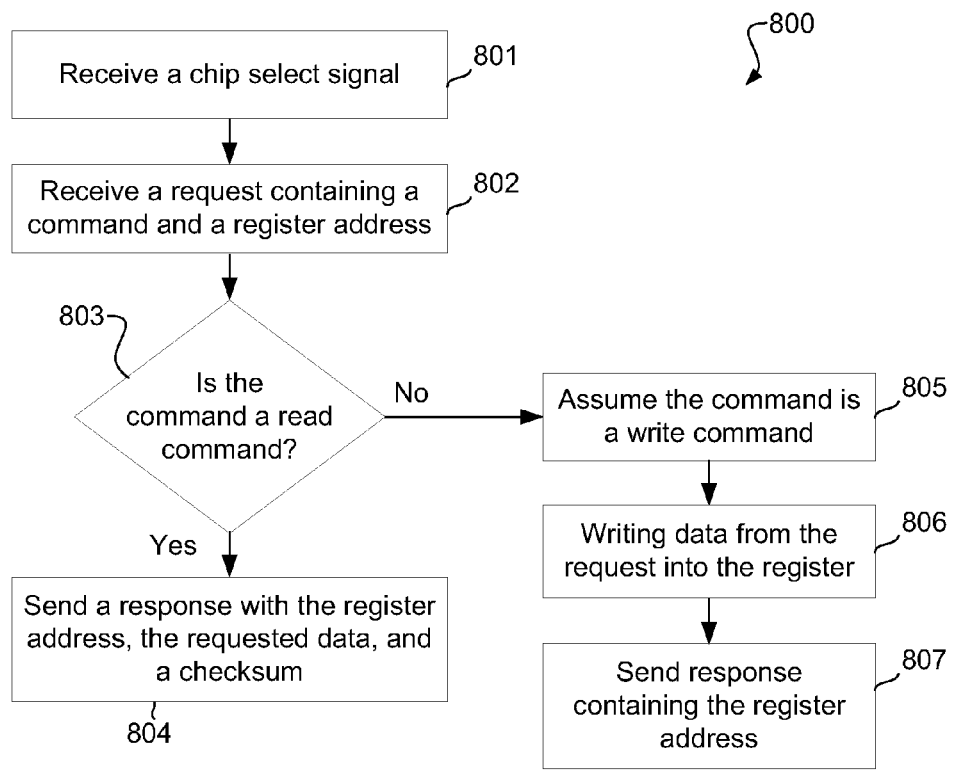
FIG. 8 is a diagram of an illustrative flowchart of a process for communicating, according to principles described herein.

FIG. 8 is a diagram of an illustrative flowchart (800) of a process for communicating, according to principles described herein. In this example, the process includes receiving (801) a chip select signal and receiving (802) a request containing a command and a register's address. The process includes determining (803) whether the command is a read command. In this example, if the command is a read command, the process includes sending (804) a response with the register's address, the requested data, and a checksum.

In the example of FIG. 8, if the command is not a read command, then process assumes (805) that the command is a write command. In such a situation, the process includes writing (806) data from the request into the register and sending (807) a response containing the register's address.

While the above examples have been describe with specific response and request sequences, any response or request sequences are included within the scope of the principles described herein. Further, while specific examples have been described above for selecting a register, any mechanism for selecting a register is within the principles described herein. Also, while specific examples have described specific arrangement for wiring the first and second devices together, any wiring arrangement or mechanism of communicating between the first and the second devices is within the scope of the principles described herein. Further, while the above examples have referred to specific types of checksums, any type of error checking mechanism may be used in accordance with the principles described herein.

Further, while specific examples of requests have been described with write and read commands, requests with other commands types are within the scope of the principles described herein. Further, while the examples above have referred to specific devices and device components to house processors and registers, any device or device components may be used to house the processor or the registers. Further, while the examples above have referred to specific environments that are prone to creating electrical noise, the devices may be used in any environment, whether the environment is prone to generating electrical noise or not.

While the above examples have been described with specific treatment of corrupted data or data deemed unreliable, the principles described herein include any appropriate treatment of corrupted data. For example, corrupted or unreliable data may be ignored. In some examples, just portions of the received data are ignored if those portions of the data are deemed unreliable while the remainder of the data is processed. In other examples, the corrupted or unreliable data is subjected to error correction techniques.

Further, while the examples described herein have been described with reference to data corruption through noise, the principles described herein may be applied to communications where data is corrupted for any reason. A non-exhaustive list of reasons for data corruption compatible with the principles described herein include electrical noise, thermal temperature variations, data aging, hardware malfunctions, firmware malfunctions, network crashes, user error, radiation, programming error, computer viruses, adware, interruptions in transmission, microwaves, electrical reflections, errors in the request, other reasons, or combinations thereof.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for communicating with verified data, comprising:
   receiving, with a first physical device, a request, said request addressed to a register within said first device and comprising an address of the register; and
   sending a response with said first device to a second device, said response comprising the address of said register.

2. The method of claim 1, further comprising receiving a chip select signal prior to receiving said request.

3. The method of claim 1, wherein receiving a request with a first device addressed to a register within said first device includes said request comprising a first byte comprising a command and a second byte comprising said address of said register.

4. The method of claim 3, wherein said command is a read command.

5. The method of claim 3, wherein said command is a write command.

6. The method of claim 1, wherein said response further comprises data requested in said request and a checksum to protect said data.

7. The method of claim 6, further comprising:
   evaluating the checksum; and
   determining whether the checksum indicates that the data is corrupted.

8. The method of claim 1, wherein the first device is a power meter for measuring energy consumption, and the second device is a device for obtaining measurements from the first device.

9. The method of claim 1, further comprising comparing the address of the register to which the request was sent to the register's address in the response.

10. The method of claim 1, wherein communication between the first device and the second device is conducted via a serial peripheral interface (SPI) bus.

11. The method of claim 10, wherein a processor of the second device and the register are arranged in an independent master/slave topology wherein the processor is directly connected to the register with an independent wire.

12. A computer program product, comprising:
   a tangible computer readable storage medium, said computer readable storage medium comprising computer readable program code embodied therewith, said computer readable program code comprising:
      computer readable program code to send a request for data to a register, said request comprising an address of said register; and
      computer readable program code to receive a response to said request, said response comprising the address of said register and said data with a checksum;
      computer readable program code to compare said address in said response to said register in said request upon receipt of said response.

13. The computer program product of claim 12, further comprising computer readable program code to resend said request when said address in said response fails to match said register in said request.

14. The computer program product of claim 12, further comprising computer readable program code to evaluate said checksum to determine whether said data is corrupted.

15. A system for communicating with verified data, comprising:
   a processor programmed to send a request to a register over a bus for data, said request comprising an address of said register;
   receive a response comprising the address of said register and said data; and
   compare said address in said response to said address upon receipt of said response.

16. The system of claim 15, wherein said processor is further programmed to evaluate a checksum sent with said data upon receipt of said response.

17. The system of claim 16, wherein said processor is further programmed to resend said request when said checksum indicates that said data is corrupted.

18. The system of claim 15, wherein said processor is further programmed to resend said request when said address in said response fails to match said register.

19. The system of claim 15, wherein said processor is incorporated in a power meter.

* * * * *